United States Patent [19]

Black et al.

[11] 4,124,844
[45] Nov. 7, 1978

[54] ANALOG TO DIGITAL CONVERTER HAVING A HIGH SPEED SUBTRACTION CIRCUIT

[75] Inventors: Stephen R. Black, Bountiful, Utah; Gary A. Gibbs, Mesa, Ariz.

[73] Assignee: Motorola, Inc., Schaumburg, Ill.

[21] Appl. No.: 694,734

[22] Filed: Jun. 10, 1976

[51] Int. Cl.² ............................................ H03K 13/02
[52] U.S. Cl. ............................................. 340/347 AD
[58] Field of Search ................. 340/347 AD; 378/158

[56] References Cited

U.S. PATENT DOCUMENTS

| | | | |
|---|---|---|---|
| 3,721,975 | 3/1973 | Brinkman | 340/347 AD |
| 3,789,389 | 1/1974 | Lenhoff | 340/347 AD |

Primary Examiner—Charles D. Miller
Attorney, Agent, or Firm—Anthony J. Sarli, Jr.

[57] ABSTRACT

An analog to digital converter for converting an analog input voltage into a four most significant bit group and a four least significant bit group of digital outputs at a first and a second group of output terminals. The complete analog to digital converter includes a first analog to digital converter for converting the analog input voltage into a four most significant bit group of digital outputs at the first group of output terminals. A digital to analog converter which is coupled to the first group of output terminals converts the four most significant bit group of digital outputs into a first analog current which is proportional to the magnitude of the four most significant bit group of digital outputs and into a second analog current such that the sum of the first and the second analog currents is a constant. An analog subtraction means which is responsive to the analog input voltage and to the first and second analog currents generates an analog output voltage having a magnitude representative of the four least significant bit group of digital outputs. A second analog to digital converter which is coupled to the analog subtraction circuit converts the analog output voltage into the four least significant bit group of digital outputs at the second output terminal means.

3 Claims, 4 Drawing Figures

ANALOG TO DIGITAL CONVERTER HAVING A HIGH SPEED SUBTRACTION CIRCUIT

BACKGROUND OF THE INVENTION

This invention relates to analog to digital (A/D) converters and more particularly, to a high speed analog subtraction circuit for use in A/D converters.

The most critical and usually the slowest function in a successive approximation A/D converter is the analog subtraction circuit. Typically an analog subtraction circuit consists of a high gain op amp which has an output connected to a series resistor. Since a highly accurate subtraction is required the gain of the op amp must also be quite high. As a direct result of the high gain required of the op amp RC time constant errors associated with op amp subtraction circuits severely limit their bandwidth. Even the most advanced high speed IC op amps have a gain bandwidth product on the order of 10 mHz. This relatively narrow bandwidth is a serious disadvantage when an extremely high speed, high accuracy subtraction circuit is required.

Therefore, it is a feature of this invention to provide an improved high speed analog subtraction circuit for use in an A/D converter which has a bandwidth of at least one hundred Megahertz.

It is another feature of this invention to provide a high speed analog subtraction circuit for use in an A/D converter which does not require an op amp with its associated gain and settling time errors.

It is yet another feature of the present invention to provide an analog subtraction circuit which uses a resistor to convert an analog current to an analog voltage.

It is still another feature of this invention to provide a high speed analog subtraction circuit for an A/D converter which has an internal voltage switching node which is clamped to minimize the voltage swing and parasitic capacitance at that node which thereby reduces the circuit RC time constant to approximately 1.2 nanoseconds.

SUMMARY OF THE INVENTION

A preferred embodiment of the present invention includes an analog to digital converter for converting an analog input signal into a most significant bit group and a least significant bit group of digital outputs at a first and a second output terminal means, respectively. This embodiment comprises a first A/D converter means, a second A/D converter means, a D/A converter means and an analog subtraction circuit means. The first A/D converter means converts the analog input voltage into the most significant bit group of digital outputs at the first output terminal means. The D/A converter means is coupled to the first output terminal means and converts the most significant bit group of digital outputs into a first analog current which is proportional to the magnitude of the most significant bit group of digital outputs and into a second analog current such that the sum of the first and second analog currents is a constant. The analog subtraction circuit means is responsive to the analog input voltage and to the first and second analog currents and generates an analog output voltage which has a magnitude representative of the least significant bit group of digital outputs. The second A/D converter means is coupled to the analog subtraction means and converts the analog output voltage into the least significant bit group of digital outputs at the second output terminal means.

BRIEF DESCRIPTION OF THE DRAWINGS

The invention is pointed out with particularity in the appended claims. However, other objects and advantages, together with the operation of the invention, may be better understood by reference to the following detailed description taken in connection with the following illustrations wherein:

DESCRIPTION OF THE PREFERRED EMBODIMENT

In order to better illustrate the advantage of the invention and its contribution to the art, a preferred hardware embodiment of the invention will now be described in some detail.

Figure 1:
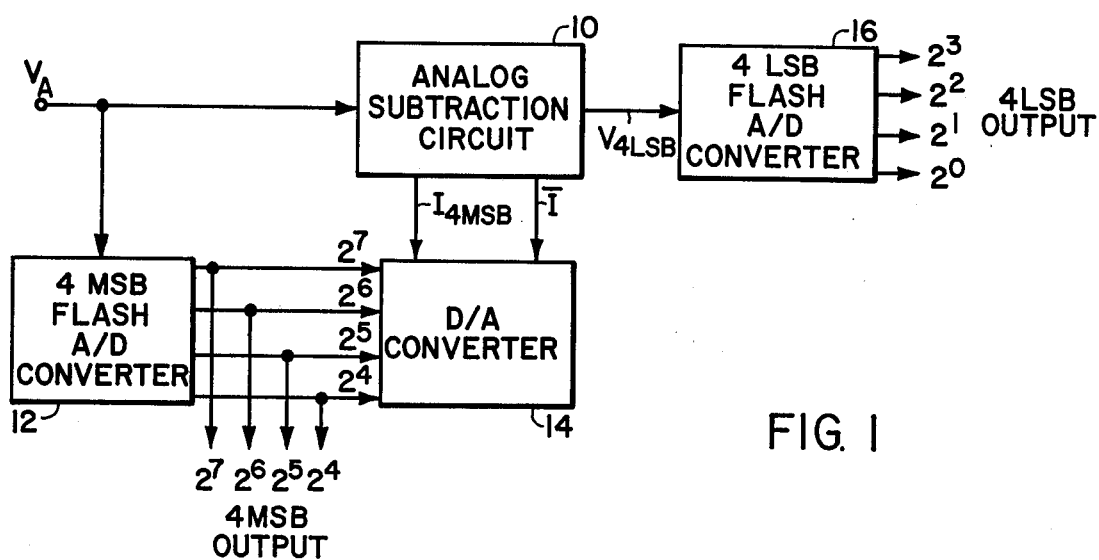
FIG. 1 is a generalized block diagram showing a hardware embodiment of the invention in a high speed eight-bit A/D converter.

Referring to the drawings and first to FIG. 1, a block diagram of a complete A/D converter embodying the high speed analog subtraction circuit of the present invention is shown. The unknown analog input voltage $V_A$ is applied simultaneously to the analog subtraction circuit 10 and to a four most significant bit (4MSB) flash A/D converter 12. A/D converter 12 generates with greater than eight bit accuracy four individual digital outputs corresponding to binary levels $2^7$, $2^6$, $2^5$ and $2^4$ at its output terminals. These four digital outputs from A/D 12 are coupled to a current output digital to analog (D/A) converter 14 and to a 4MSB output. In response to the four digital inputs from A/D converter 12, D/A converter 14 generates two analog output currents, $I_{4MSB}$ and $\bar{I}$. In response to the analog input voltage $V_A$ and to the analog input currents $I_{4MSB}$ and $\bar{I}$, the analog subtraction circuit 10 generates an analog output voltage $V_{4LSB}$ which has a magnitude equivalent to the four least significant bits of the unknown analog input voltage $V_A$. The $V_{4LSB}$ analog output voltage from analog subtraction circuit 10 is coupled to the 4LSB flash A/D converter 16 which converts $V_{4LSB}$ into four individual digital outputs on four output conductors corresponding to binary levels of $2^3$, $2^2$, $2^1$ and $2^0$.

An analog input signal $V_A$ from high speed sample and hold circuit having a minimum hold time of 30 to 50 nanoseconds is applied to both A/D converter 12 and to analog subtraction circuit 10. The 4MSB A/D converter 12 converts $V_A$ to a 4MSB bit digital signal with better than eight bit accuracy. The circuitry of A/D converter 12 consists of 16 comparators coupled in parallel with a linear to binary decoding arrangement. A/D converter 12 is a high speed device which performs the first step of a two step series to parallel analog to digital conversion.

D/A converter 14 is of the current output variety and converts the 4MSB digital input signal from A/D converter 12 into two output currents, $I_{4MSB}$ and $\bar{I}$ with better than eight bit accoracy. Output current $I_{4MSB}$ is the analog equivalent of the 4MSB digital input signal.

The following current relationship will hold true during steady state conditions:

$$I_{TOTAL} = I_{4MSB} + \bar{I}$$

As can be seen from the above equation, whenever $I_{4MSB}$ increase, $\bar{I}$ will decrease. If the digital input signal to D/A converter 14 consists of a binary 1111, the output current $I_{4MSB}$ will be at a maximum and the $\bar{I}$ current will be at a minimum. Correspondingly, when the digital input to D/A converter 14 consists of a binary 0000, the output current $I_{4MSB}$ will be at a minimum and the $\bar{I}$ current will be at a maximum.

Analog subtraction circuit 10 receives the analog input voltage $V_A$ at the same time that A/D converter 12 is generating the 4MSB digital output. Analog subtraction circuit 10 subtracts an analog voltage which is equivalent to the 4MSB digital output of A/D converter 12 and generates an analog output voltage $V_{4LSB}$. A slightly simplified equation which represents the function performed by analog subtraction circuit 10 is as follows:

$$V_A - V_{4MSB} = V_{4LSB}$$

The four least significant bit (4LSB) A/D converter 16 is identical to A/D converter 12 except that a different extenal reference voltage is applied to it. A/D converter 16 receives the $V_{4LSB}$ analog input signal and converts it to a 4LSB digital output signal on binary output terminals $2^3$, $2^2$, $2^1$, and $2^0$.

In this manner the unknown analog input voltage $V_A$ has been converted to an eight bit digital output signal part of which appears at the 4MSB output and the remainder of which appears at the 4LSB output.

Figure 2:
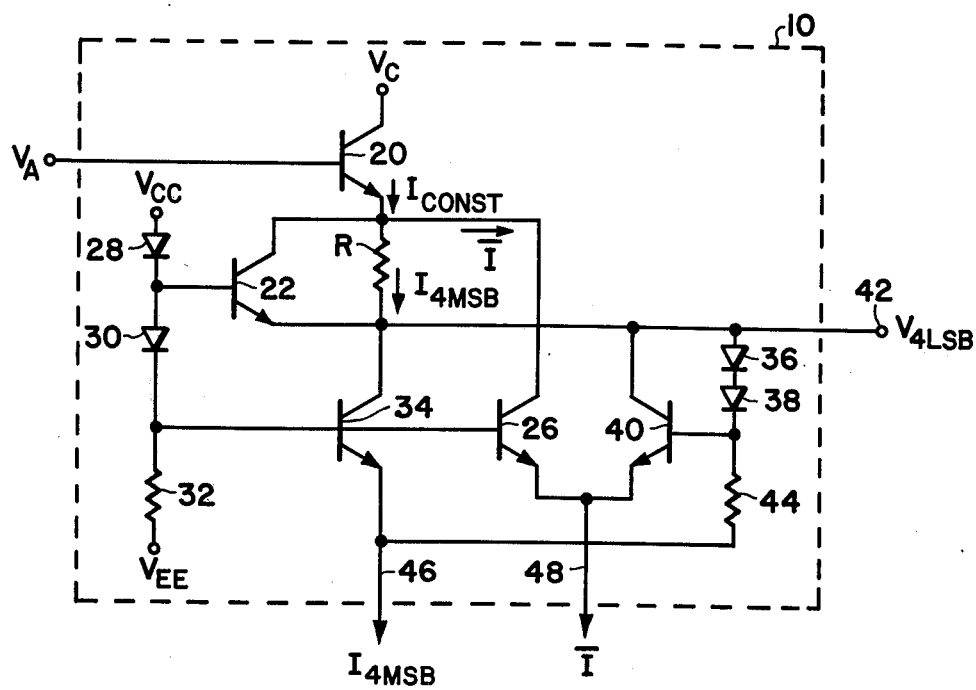
FIG. 2 is a schematic diagram showing one possible hardware embodiment of the analog subtraction circuit of the present invention.

FIG. 2 shows a schematic diagram of a preferred embodiment of analog subtraction circuit 10. The analog input voltage $V_A$ is connected to the base of transistor 20. Power supply voltage $V_C$ is coupled to the collector of transistor 20 while the emitter of transistor 20 is connected to the collector of transistor 22, to the upper terminal of subtraction resistor R, and to the collector of transistor 26. Power supply voltage $V_{CC}$ is coupled to the anode of diode 28. The anode of diode 30 is coupled to the base of transistor 22 and to the cathode of diode 28. The cathode of diode 30 is coupled to bias register 32 and to the bases of transistors 34 and 26. Power supply voltage $V_{EE}$ is coupled to the lower terminal of resistor 32. Series coupled diodes 36 and 38 are connected to the base of transistor 40 and to the voltage output conductor 42. Resistor 44 is coupled between the base of transistor 40 and current output conductor 46. Current output conductor 46 is further coupled to the emitter of transistor 34. The emitters of transistors 26 and 40 are coupled together and to current output conductor 48.

The primary circuitry of the FIG. 2 circuit consists of transistor 20, subtraction resistor R, and cascode connected transistor 34. The basic equation performed by analog subtraction circuit 10 is as follows:

$$V_{4LSB} = V_A - V_{BE} - RI_{4MSB} \tag{1}$$

The following two equations are also relevant to the function of analog subtraction circuit 10:

$$V_A = V_{4MSB} + V_{4LSB} \tag{2}$$

$$I_{TOTAL} = I_{MSB} + \bar{I} \tag{3}$$

The analog output current $I_{4MSB}$ from D/A converter 14 establishes a current through subtraction resistor R and transistor 34. The current $I_{4MSB}$ establishes a voltage drop across subtraction resistor R which is the analog equivalent of the 4MSB output of A/D converter 12. Therefore, the voltage drop across subtraction resistor R is equal to $RI_{4MSB}$.

Transistor 20 serves as a buffer amplifier. As will be explained later the emitter current flowing through transistor 20 will always be constant and due to that fact the base emitter voltage drop ($V_{BE}$) across transistor 20 will also be absolutely constant for all values of $V_A$. Buffer transistor 20 also isolates the analog input voltage $V_A$ from the circuitry contained in analog subtraction circuit 10.

During the design of analog subtraction circuit 10 the value of subtraction resistor R is adjusted such that the following equation will hold true:

$$RI_{4MSB} = V_{4MSB} \tag{4}$$

Transistor 26 is another cascode connected buffer which conducts current $\bar{I}$ from the emitter of transistor 20 to the $\bar{I}$ current output on D/A converter 14.

As can be seen from equation (1) above, $V_{4LSB}$ is reduced by the $V_{BE}$ voltage drop across transistor 20. To insure a highly accurate output signal the reference voltage applied to the 16 parallel coupled comparators of A/D converter 16 is also offset by a voltage exactly equal to the $V_{BE}$ voltage drop across transistor 20. This is accomplished by generating a reference offset voltage with a transistor operating at the same junction current density as transistor 20. In this manner there is perfect tracking between the analog subtraction circuitry 10 and A/D converter 16.

The advantage of using transistors 34 and 26 in a cascode coupled configuration is that they produce very small voltage swings and therefore reduce the number of parasitic RC time constants present at that node in the circuit to achieve the desired accuracy.

Figure 3:
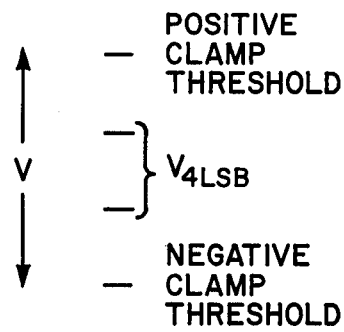
FIG. 3 is a diagram indicating the normal voltage output range of the analog subtraction circuit and the positive and negative clamp threshold levels.

During normal operation, FIG. 3 shows that the analog subtraction circuit 10 output voltage $V_{4LSB}$ swings within relatively small limits in response to changes of the analog input voltage $V_A$. However, when ever the value of $V_A$ changes, the output of D/A converter 14 generates transients of substantial magnitude when switching values of output current. During these transient conditions none of the mathematical equations set out above hold true. These large transients would normally cause transistors 34 and 26 to saturate, thereby drastically reducing their switching speed. In order to prevent these transistors from entering saturation and thereby drastically reducing the speed of the entire analog subtraction circuit 10, a positive clamp threshold and a negative clamp threshold are set at levels slightly beyond the normal output swing of output voltage $V_{4LSB}$, as is shown in FIG. 3. Since during these switching transients the entire A/D converter circuit is not generating a meaningful output, it is not necessary that any of the above equations remain valid.

The negative clamp circuit consists of diode 28 and transistors 22. Whenever the voltage on the lower terminal of subtraction resistor R falls below the threshold voltage of the negative clamp, the base-collector junction of transistor 22 is forward biased and any excess current is shunted around resistor R through transistor 22.

The positive clamp circuit consists of transistor 40 and diodes 36 and 38. During a transient condition when the output voltage $V_{4LSB}$ reaches the positive threshold of the positive clamp circuit, transistor 40 is turned on pulling current through resistor R and thereby maintaining the output voltage $V_{4LSB}$ at the predetermined positive clamp threshold voltage.

The presence of a positive and a negative clamp circuit greatly increases the speed of the entire A/D converter by reducing the time which would otherwise be required to settle out voltages appearing across large RC time constants.

During transient conditions the following two equations will apply:

$$I_{TOTAL} \neq I_{4MSB} + I$$

$$V_{4LSB} \neq V_A - V_{4MSB}$$

The circuitry consisting of transistor 22 and diode 30 forms an additional clamping circuit which prevents the collector voltage of transistor 34 from falling below its base voltage. This clamping circuit prevents transistors 34 from becoming saturated. Bias resistor 32 merely completes the bias chain consisting of diodes 28 and 30, all of which are coupled between power supply levels $V_{CC}$ and $V_{EE}$. Resistor 44 serves also as a bias resistor.

Figure 4:
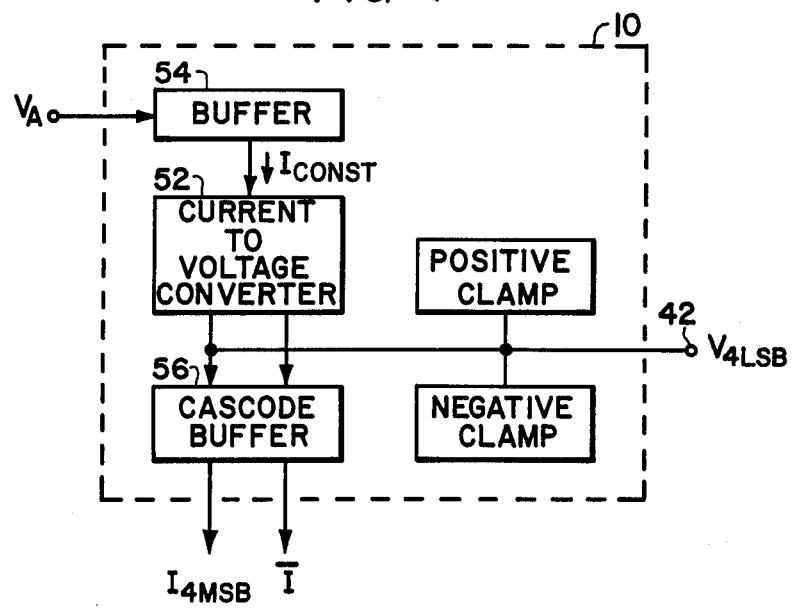
FIG. 4 is a generalized block diagram of the analog subtraction circuit of the present invention.

FIG. 4 is a simplified block diagram of the schematic diagram of subtraction circuit 10 shown in FIG. 2. FIG. 4 shows more clearly how the positive clamp circuit and the negative clamp circuit are coupled to the output voltage conductor 42. Additionally, FIG. 4 further shows that subtraction resistor R is essentially equivalent to the current to voltage converter 52.

Analog subtraction circuit 10 consists of a buffer stage 54 which receives the analog input voltage and generates a constant current output which is coupled to the current to voltage converter 52. A cascode buffer stage 56 serves as an interface between D/A converter 14 and the current to voltage converter 52. One of the two outputs of current to voltage converter 52 generates the output voltage $V_{4LSB}$.

The block diagram of FIG. 4 serves to illustrate the basic principles embodied in the high speed subtraction circuit on a more highly conceptual level.

While a particular embodiment of the invention has been shown and described, it will be understood that the invention is not limited thereto, since many modifications may be made and will become apparent to those skilled in the art.

What is claimed is:

1. An analog digital converter for converting an analog input voltage into an MSB group and an LSB group of digital outputs at a first and a second output terminal means, respectively, comprising:

first A/D converter means for converting the analog input voltage into the MSB group of digital outputs at said first output terminal means, D/A converter means coupled to said first output terminal means for converting the MSB group of digital outputs into a first analog current which is proportional to the magnitude of the MSB group of digital outputs and into a second analog current such that the sum of the first and second analog currents is a constant, analog subtraction circuit means responsie to the analog input voltage and to the first and second analog currents for generating an analog output voltage having a magnitude representative of the LSB group of digital outputs, said analog subtraction circuit means comprising means for clamping said analog output voltage at a predetermined upper threshold voltage and means for clamping said analog output voltage at a predetermined lower threshold voltage, said analog subtraction circuit means further comprising cascode buffer means in the current paths of said first and second analog currents to minimize voltage swings in said analog output voltage, and second A/D converter means coupled to said analog subtraction circuit means for converting the analog output voltage into the LSB group of digital outputs at said second output terminal means.

2. An analog to digital converter according to claim 1 wherein said analog subtraction circuit means further includes means for converting said analog input voltage into a buffered analog voltage.

3. An analog to digital converter according to claim 2 wherein said voltage to buffered voltage voltage converting means includes a first transistor the base of which receives the analog input voltage, the collector of which is coupled to a voltage conductor, and the emitter of which is coupled to said resistive means.

* * * * *